(12) United States Patent
Walker

(10) Patent No.: US 11,101,451 B2
(45) Date of Patent: Aug. 24, 2021

(54) MECHANICALLY PRE-BIASED SHADOW MASK AND METHOD OF FORMATION

(71) Applicant: eMagin Corporation, Hopewell Junction, NY (US)

(72) Inventor: James A. Walker, Hilton Head Island, SC (US)

(73) Assignee: eMagin Corporation, Hopewell Junction, NY (US)

( * ) Notice: Subject to any disclaimer, the term of this patent is extended or adjusted under 35 U.S.C. 154(b) by 342 days.

(21) Appl. No.: 15/968,443

(22) Filed: May 1, 2018

(65) Prior Publication Data

US 2018/0315962 A1     Nov. 1, 2018

Related U.S. Application Data

(60) Provisional application No. 62/492,659, filed on May 1, 2017.

(51) Int. Cl.
    *C23C 16/34*          (2006.01)
    *C23C 16/56*          (2006.01)
    (Continued)

(52) U.S. Cl.
    CPC ............ *H01L 51/56* (2013.01); *C23C 14/042* (2013.01); *C23C 14/24* (2013.01); *C23C 16/345* (2013.01); *C23C 16/56* (2013.01); *H01L 51/0011* (2013.01)

(58) Field of Classification Search
    CPC ... H01L 51/56; H01L 51/0011; C23C 16/345; C23C 16/56; C23C 14/24; C23C 14/042
    See application file for complete search history.

(56) References Cited

U.S. PATENT DOCUMENTS

| | | | | |
|---|---|---|---|---|
| 4,919,749 A | * | 4/1990 | Mauger | G03F 1/20 204/192.3 |
| 9,142,779 B2 | | 9/2015 | Chan et al. | |

(Continued)

OTHER PUBLICATIONS

J. G. E. Gardeniers et al., "LPCVD silicon-rich silicon nitride films for applications in micromechanics, studied with statistical experimental design", "J. Vac. Sci. Technol. A", dated Sep. 1, 1996, pp. 2879-2892, vol. 14, No. 5, Publisher: American Vacuum Society.

(Continued)

*Primary Examiner* — Dah-Wei D. Yuan
*Assistant Examiner* — Nga Leung V Law
(74) *Attorney, Agent, or Firm* — Kaplan Breyer Schwarz, LLP

(57) ABSTRACT

Shadow masks comprising a multi-layer membrane having a mechanical pre-bias that compensates the effect of gravity on the membrane are disclosed. A shadow mask in accordance with the present disclosure includes a membrane that is patterned with a desired pattern of apertures. The layers of the membrane are selected such that their residual stresses collectively give rise to a stress gradient that is directed normal to the plane of the membrane such that the stress gradient mitigates gravity-induced sag. In some embodiments, the membrane includes a layer pair having internal stresses that are of opposite signs to effect a tendency to bulge outward from the plane of the membrane prior to its release from the substrate. An exemplary membrane includes a layer pair comprising a layer of stoichiometric silicon dioxide that is under residual compressive stress and a layer of stoichiometric silicon nitride that is under residual tensile stress.

11 Claims, 5 Drawing Sheets

(51) Int. Cl.
 *C23C 14/04* (2006.01)
 *C23C 14/24* (2006.01)
 *H01L 51/56* (2006.01)
 *H01L 51/00* (2006.01)

(56) References Cited

U.S. PATENT DOCUMENTS

2015/0041793 A1* 2/2015 Chan .................. H01L 51/0018
 257/40
2017/0342542 A1 11/2017 Ghosh et al.

OTHER PUBLICATIONS

Fu-Ching Tung et al., "OLED Fabrication by Using a Novel Planar Evaporation Technique", http://dx/doi.org/10.1155/2014/683037, "International Journal of Photoenergy", dated Jun. 22, 2014, p. 8, vol. 2014, No. Article ID 683037, Publisher: Hindawi Publishing Corporation, Published in: TW.
Requirement for Restriction/Election dated Jun. 10, 2020 for U.S. Appl. No. 15/968,325.
Non-Final Rejection dated Sep. 25, 2020 for U.S. Appl. No. 15/968,325.

\* cited by examiner

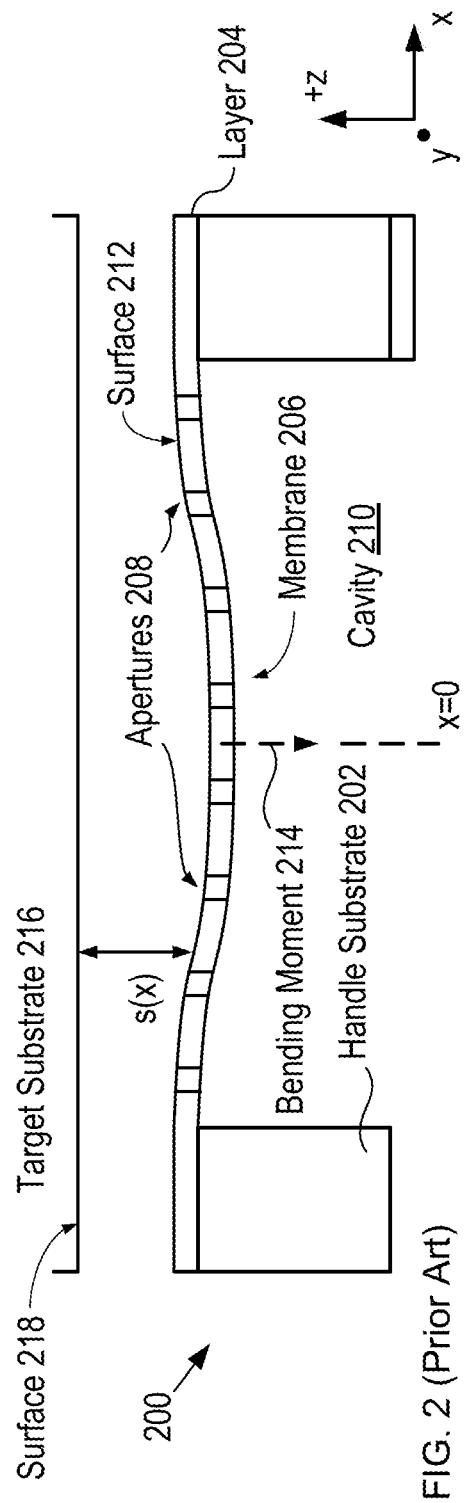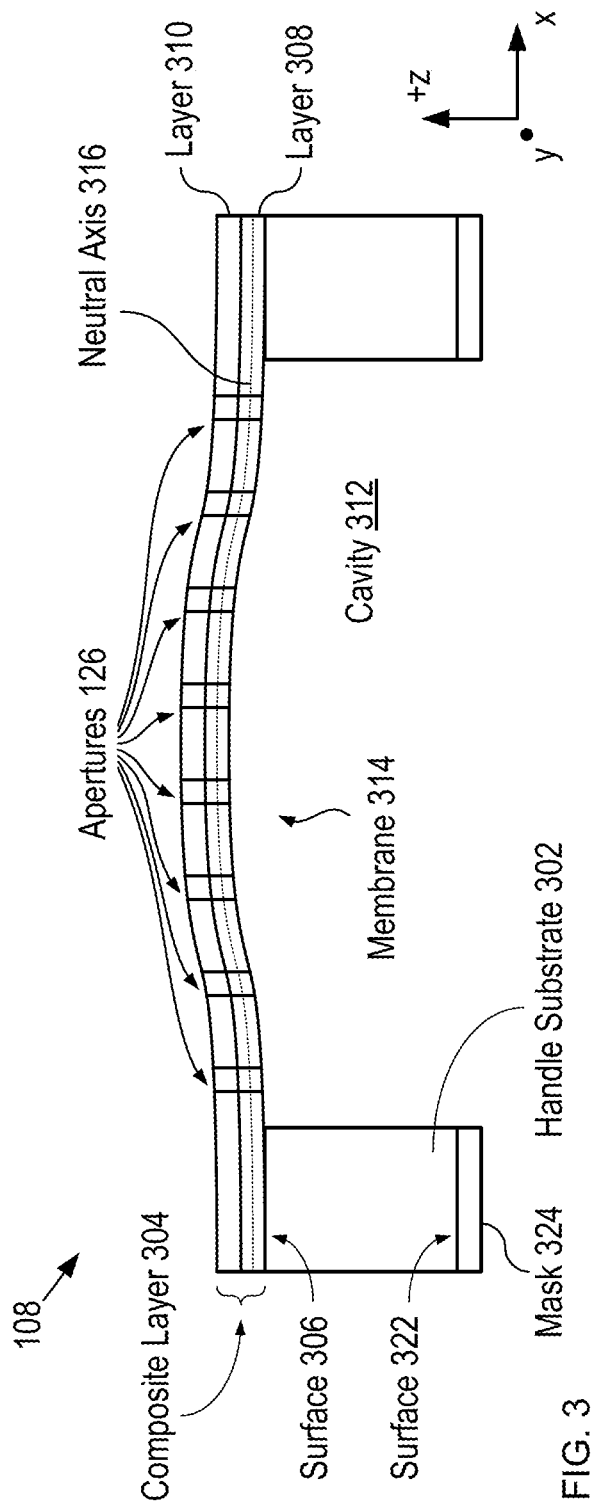
FIG. 2 (Prior Art)
FIG. 3

MECHANICALLY PRE-BIASED SHADOW MASK AND METHOD OF FORMATION

STATEMENT OF RELATED CASES

This case claims priority to U.S. Provisional Patent Application Ser. No. 62/492,659 filed on May 1, 2017, which is incorporated herein by reference.

TECHNICAL FIELD

The present disclosure relates to material deposition in general, and, more particularly, to direct patterning of a material layer on a substrate via deposition of the material onto the substrate through a shadow mask.

BACKGROUND

Semiconductor fabrication requires the formation of one or patterned layers of material on the surface of a substrate. The most common approach for forming a material pattern is to deposit a full-surface layer of the material over the entire surface of the substrate and then remove the material everywhere except where it is desired. This is commonly referred to as "subtractive patterning."

Unwanted material is removed in a multi-step process in which a layer of photoresist is formed over the material layer and illuminated with a pattern of light that is based on the desired material pattern. After it has been exposed, the photoresist covering the unwanted material is dissolved in a strongly basic developer solution, which leaves behind a photoresist mask that covers the material to remain on the substrate. An etchant is then used to remove the exposed material, thus patterning the material pattern as desired. Afterward, the photoresist mask must be removed and the substrate must be thoroughly cleaned to ensure no residue of photoresist or etch product remains on any of its surfaces.

During a subtractive patterning process, everything on the substrate (i.e., any previously defined structures and materials, etc.) is exposed to harsh chemicals, including the photoresist developer solution, the etchant used to pattern the material layer, and the chemicals used to clean the substrate. Unfortunately, many materials, such as organic and biological materials, cannot survive exposure to one or more of these chemicals. As a result, subtractive patterning cannot be used for such "sensitive materials" or to pattern any material layer formed subsequent to deposition of a sensitive material on a substrate. For such operations, therefore, a direct patterning process must be used.

A direct patterning process forms a desired pattern of material as it is deposited, thereby avoiding the need for post-deposition treatments and the harsh chemicals they normally involve. One such direct-patterning process is shadow-mask deposition, which is analogous to stencil-based printing techniques, such as stencil painting, silk screen printing, and the like.

During shadow-mask deposition, vapor molecules of the material are generated such that they flow from a source toward the substrate surface. The vapor molecules can be generated via any of a variety of processes, such as evaporation, sputtering, and the like. A thin layer of structural material having a pattern of apertures (i.e., openings) that matches the pattern desired for the deposited material (referred to as a "shadow mask") is positioned just in front of (but typically not in contact with) the substrate surface. When the flow of material reaches the shadow mask, the passage of material to the substrate is blocked everywhere except at the apertures. As a result, the material layer is directly patterned during its deposition on the substrate and no additional post-deposition processing is required.

Historically, shadow-mask deposition has been used in semiconductor fabrication to define patterns of relatively large (>50 micron) features, such as wire-bond pads, etc. A typical shadow mask used in such applications includes a thin, patterned metal sheet held by an annular frame. While the minimum feature size and minimum separation between apertures for such shadow masks is quite large (typically greater than several tens of microns), such shadow masks are perfectly suitable for defining large-feature-size, sparse patterns of material like wire-bond pad patterns.

More recently, it has become desirable to employ shadow-mask deposition in the formation of electronic devices based on organic materials, such as organic light-emitting diodes (OLED), active-matrix OLED displays, organic solar cells, biological-material-based sensors, and the like. In many cases, much higher resolution and pattern density is required than can be achieved with a conventional metal-layer-based shadow mask. As a result, high-performance shadow masks have been developed that enable feature sizes and pattern densities that are less than or equal to ten microns.

Such high-performance shadow masks typically have a very thin (<1 micron) layer of structural material (e.g., silicon nitride, silicon, etc.) disposed on an annular frame formed from a semiconductor or glass handle substrate. The apertures are formed in the thin structural layer, after which the center portion of the handle substrate is removed, leaving the central region of the structural layer as a patterned edge-supported membrane.

Theoretically, during shadow-mask deposition, material deposits only on the surface of the substrate in those regions located directly behind the apertures. In practice, however, as the vaporized molecules travel from the source to the shadow mask, many vaporized molecules propagate along directions that are not perfectly normal to the shadow mask and substrate. As a result, some vaporized molecules continue to travel laterally after passing through the shadow mask such that the resultant patterned regions extend beyond the edges of the apertures. The magnitude of this lateral spreading of the features (referred to as "feathering") is a function of the separation distance between the substrate surface and the shadow mask, which is preferably very small—a few microns at most, as well as the orientation of the source relative to the center of the shadow mask.

While feathering is not a critical issue when forming large, widely spaced features (e.g., wire-bond pads, etc.), it can be highly problematic when forming small-feature, highly dense patterns. In fact, feathering has been a limiting factor for the minimum feature size and pattern density attainable using shadow-mask deposition.

Furthermore, many applications, such as high-resolution OLED display fabrication, require dense patterns of small features (<10 microns) that extend over a large area (greater than tens of centimeters). This requires a shadow mask that is both very thin (to mitigate shadowing and enable fine feature definition) and very large (lateral extents of tens of centimeters). Unfortunately, thin, large-area membranes exhibit significant gravity-induced sag. For shadow masks of several inches in diameter, such sag can give rise to a significant variation (several microns or more) in the separation distance between the substrate surface and the shadow mask over the area of the shadow mask. This, in turn, leads to increased feathering near the center of the shadow mask and an overall variation in the magnitude of the feathering that occurs across the area of the deposited pattern.

To mitigate the effect of gravity-induced shadow-mask sag in the prior-art, a mechanical grid of support material is sometimes placed under the shadow mask membrane. Alternatively, regions of the shadow mask substrate can be left intact during its fabrication to provide support over the area of the membrane. Unfortunately, these approaches give rise to shadowing effects that lead to poor deposition uniformity over the surface area of the substrate.

The need for a shadow-mask capable of defining high-resolution directly deposited layers without shadowing remains, as yet, unmet in the prior art.

SUMMARY

The present disclosure presents apparatus and methods that enable direct patterning of a material layer via shadow-mask deposition without some of the costs and disadvantages of the prior art. Embodiments of the present invention mitigate shadow mask sag due to gravity, thereby enabling directly patterned layers having smaller minimum features and higher pattern density. Embodiments of the present invention are particularly well suited for use in fabricating organic light-emitting diodes (OLEDs), OLED displays, organic solar cells, and the like.

Embodiments in accordance with the present disclosure are shadow masks and shadow-mask-based deposition processes, where the shadow-mask includes a multi-layer membrane formed on a handle substrate, and where the constituent layers of the membrane collectively give rise to a stress gradient that is directed normal to the plane of the membrane. When arranged in a deposition system such that the membrane is horizontal, he stress gradient effects a mechanical prebias that compensates for the effect of gravity on the membrane. As a result, gravity-induced sag can be mitigated.

The multi-layer membrane comprising a first layer of a first material that is characterized by a residual tensile stress and a second layer of a second material characterized by a residual compressive stress. The thicknesses and stresses of the layers are chosen such that the position of the stress-neutral plane of the composite membrane is displaced from the middle of its thickness, thereby giving rise to a bending moment normal to the membrane. In accordance with the present disclosure, the first and second layers are formed on a rigid handle substrate before the membrane is released from the substrate by forming a cavity in it. As a result, each of the first and second layer is characterized by a residual stress induced in the layer during its formation on the rigid substrate.

Upon release of the multi-layer membrane from the handle substrate, its constituent layers attempt to relieve their internal strain such that the compressively stressed layer laterally expands while the tensilely stressed layer laterally contracts. As a result, the membrane is mechanically pre-biased to "bulge" to attain its lowest possible strain-energy state. By orienting the shadow mask such that the mechanical pre-bias is in the direction opposite to that of gravity, sag of the membrane due its own weight is mitigated.

An illustrative embodiment includes a bilayer membrane in which the first layer is stoichiometric silicon nitride and the second layer is stoichiometric silicon dioxide, where the first layer has a thickness of approximately 50 nm and a residual tensile stress of approximately 1 GPa and the second layer has a thickness of approximately one micron and a residual compressive stress of approximately 300 MPa. In some embodiments, at least one of the first and second layers has a different thickness and/or residual stress.

In some embodiments, the membrane includes more than two layers.

In some embodiments, the first layer comprises a compressively stressed material other than stoichiometric silicon dioxide. In some embodiments, the second layer comprises a tensilely stressed material other than stoichiometric silicon nitride.

In some embodiments, a portion of the substrate is left intact in the membrane region such that the membrane includes a thin layer of substrate material.

An embodiment of the present invention is an apparatus comprising a shadow mask that includes: a substrate that defines a first plane, the substrate including a cavity; and a composite layer that is disposed on the substrate, the composite layer having a first region that includes an aperture pattern comprising at least one aperture, wherein the composite layer comprises a plurality of layers that includes a first layer having a first thickness and a first residual stress and a second layer having a second thickness and a second residual stress, wherein the first region of the composite layer is disposed over the cavity and defines a membrane; wherein the first thickness, second thickness, first residual stress, and second residual stress collectively give rise to a first bending moment that is directed along a direction that is substantially normal to the first plane.

Another embodiment of the present invention is a method for forming a shadow mask, the method comprising: providing a substrate that defines a first plane; forming a composite layer on the substrate, the composite layer including: a first layer comprising a first material, the first layer having a first thickness and a first residual stress; and a second layer comprising a second material, the second layer having a second thickness and a second residual stress; defining an aperture pattern in a first region of the composite layer, wherein the aperture pattern includes at least one aperture, and wherein the at least one aperture extends completely through the composite layer; and forming a cavity in the substrate, wherein the cavity is formed after the formation of the composite layer, and wherein the formation of the cavity releases the first region of the composite layer to define a membrane; wherein the first thickness, second thickness, first residual stress, and second residual stress are selected such that the membrane has a first bending moment that is directed along a direction that is substantially normal to the first plane.

BRIEF DESCRIPTION OF THE DRAWINGS

FIG. 2 depicts a schematic drawing of a cross-sectional view of an exemplary high-resolution shadow mask in accordance with the prior art.

FIG. 3 depicts a schematic drawing of a cross-sectional view of a shadow mask 108.

DETAILED DESCRIPTION

Figure 1:
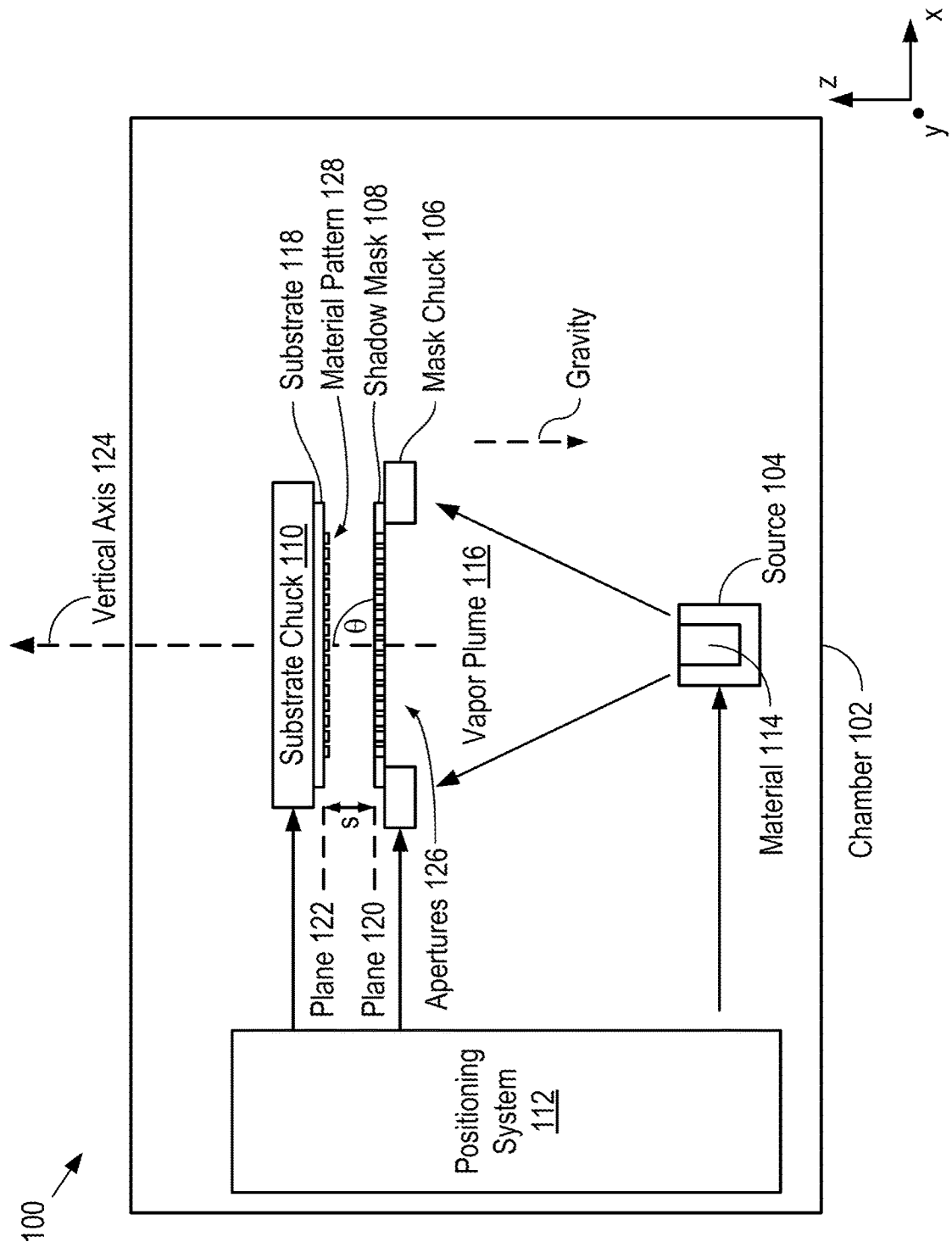
FIG. 1 depicts a schematic drawing of an illustrative embodiment of a shadow-mask deposition system in accordance with the present disclosure.

FIG. 1 depicts a schematic drawing of an illustrative embodiment of a shadow-mask deposition system in accordance with the present disclosure. System 100 includes vacuum chamber 102, source 104, mask chuck 106, shadow mask 108, substrate chuck 110, and positioning system 112. System 100 is a vertical deposition system for directly patterning an OLED material layer on substrate 118.

Vacuum chamber 102 is a conventional pressure vessel operative for providing a low-pressure atmosphere that supports evaporation of material 114. It should be noted that vacuum chamber 102 can be a standalone unit, part of a cluster deposition system, or part of a track-deposition system where multiple evaporation chambers are arranged in linear chain. In some embodiments, vacuum chamber 102 includes several evaporation sources/shadow mask combinations that enable formation of different patterns of different materials.

Source 104 is crucible for vaporizing material 114 to create vapor plume 116. In the depicted example, material 114 is an organic material suitable for use in an OLED and source 104 acts substantially as a point source for the vaporized material because the open area of its crucible is significantly smaller than the area of substrate 118.

In some embodiments, source 104 is a linear evaporation source that comprises a plurality of nozzles arranged along a longitudinal axis such that the nozzles collectively emit a fan-shaped vapor plume of vaporized atoms. In some embodiments, positioning system 112 moves the linear source along a direction that is unaligned with its longitudinal axis in the x-y plane to improve the uniformity of the deposited material on substrate 118. In some embodiments, this path is a line that is substantially orthogonal to both the linear arrangement of nozzles and normal axis 124. In some of embodiments, the linear source is moved along a non-linear path in the x-y plane.

In some embodiments, source 104 includes a two-dimensional arrangement of nozzles, each of which emits a conically shaped vapor plume such that the plurality of nozzles collectively provides a flow of vaporized atoms that is substantially uniform over the area of the substrate surface. In some embodiments, positioning system 112 moves the two-dimensional arrangement of nozzles to facilitate deposition uniformity. In some embodiments, the two-dimensional arrangement of nozzles is rotated in-plane to facilitate deposition uniformity.

In some embodiments, source 104 is a two-dimensional planar source that includes a layer of material 114 distributed across its top surface. The source is arranged such that this top surface is parallel to and facing substrate 118. When heated, material 114 vaporizes uniformly across the plane. Exemplary planar evaporation sources suitable for use in embodiments in accordance with the present disclosure are disclosed by Tung, et al., in "OLED Fabrication by Using a Novel Planar Evaporation Technique," *Int. J. of Photoenergy*, Vol. 2014(18), pp. 1-8 (2014), which is incorporated herein by reference.

In some embodiments, positioning system 112 imparts a relative motion between source 104 and the combination of substrate 118 and shadow mask 108 to improve the uniformity with which material 114 deposits over the two-dimensional surface area of substrate 118. The relative motion is imparted by moving at least one of the substrate/mask combination and the source. In some embodiments, a collimator (not shown) is inserted between source 104 and shadow mask 108 such that only vaporized atoms of material 114 traveling along directions aligned, or nearly aligned, with vertical axis 124. The inclusion of such a collimator can improve the uniformity with which material 114 deposits over the two-dimensional surface area of substrate 118. Collimators suitable for use in embodiments in accordance with the present disclosure are described in U.S. Patent Publication No.: 2017/0342542, which is incorporated herein by reference.

Mask chuck 106 is a mechanical clamp that locates shadow mask 108 between source 104 and substrate 118.

Shadow mask 108 is an element that includes a layer of structural material having a plurality of apertures whose size and arrangement are based on the desired deposition pattern for material 114. The surface of shadow mask 108 proximal to substrate 118 defines plane 120. Shadow mask 108 is described in more detail below and with respect to FIGS. 3-5.

Substrate chuck 110 is a platen for securing substrate 118 such that the substrate is as flat as possible.

Substrate 118 is a glass substrate suitable for supporting the planar-processing-based fabrication of an OLED display. In some embodiment, substrate 118 is a different conventional substrate, such as a semiconductor wafer (e.g., silicon, gallium arsenide, indium phosphide, etc.), composite substrate, etc., that is suitable for planar processing. The surface of substrate 118 that is proximal to shadow mask 108 defines plane 122.

Positioning system 112 is a multi-dimensional alignment system for controlling the relative positions of substrate 118, source 104, and shadow mask 108. In operation, positioning system 112 aligns the shadow mask and substrate such that they are separated by separation, s, (typically a few tens or hundreds of microns) along vertical axis 124, planes 120 and 122 are substantially parallel, and the apertures of the shadow mask are aligned with their respective deposition sites on substrate 118. In the depicted example, vertical axis 124 is aligned with the direction of gravity and shadow mask 108 and substrate 118 are held such that each of planes 120 and 122 is substantially orthogonal with vertical axis 124 (i.e., $\theta=90°$). In some embodiments, shadow mask 108 and substrate 118 are held such that each of planes 120 and 122 is at an angle, $\theta$, other than 90° to with respect to the direction of gravity.

When heated, source 104 melts material 114 to generate vapor plume 116. As discussed above, vapor plume 116 includes vaporized atoms having propagation directions that span a relatively large angular range. As a result, vaporized atoms travel some lateral distance after passing through the apertures of the shadow mask—referred to as "feathering." Feathering gives rise to deposition of material 114 in unintended regions of the substrate, which causes enlargement of the deposited features and/or undesirable intermixing of different materials deposited in different depositions. Feathering, therefore, can limit the minimum feature size of a deposited pattern, as well as pattern density.

The amount of feathering that occurs is determined by the lateral and rotation alignments between planes 120 and 122, the separation, s, between them, and the range of propagation angles of the vaporized atoms incident on the shadow mask.

As discussed above, while prior-art shadow masks are theoretically flat, in practice they sag significantly due to the fact that most of the shadow mask is mechanically unsupported. As a result, a cross-section through any diameter of a prior-art shadow-mask membrane assumes a substantially catenary shape (approximately a hyperbolic cosine function) such that its top surface is non-planar. For prior-art shadow masks, therefore, the separation between the shadow mask and the target-substrate surface on which deposition is desired is non-uniform, which exacerbates the problems associated with feathering.

FIG. 2 depicts a schematic drawing of a cross-sectional view of an exemplary high-resolution shadow mask in accordance with the prior art. Shadow mask 200 is analogous to high-resolution shadow masks disclosed in U.S. Pat. No. 9,142,779, which is incorporated herein by reference.

Shadow mask 200 comprises layer 204, which is a layer of structural material disposed on the top surface of handle substrate 202. The central region of the structural layer is a membrane (i.e., membrane 206) in which apertures 208 are formed to enable passage of vaporized molecules through the shadow mask to deposit in a desired pattern on surface 218 of target substrate 216. The membrane is defined by the formation of cavity 210 in handle substrate 202. In many applications, to be useful for forming large-area material patterns, the width (or diameter) of cavity 210 must be at least several tens of centimeters.

Furthermore, in order to enable direct patterning of a dense pattern of features smaller than 10 microns, layer 204 is preferably very thin—typically, having a thickness equal to one micron or less.

It is preferred that the structural material of layer 204 is characterized by a large residual tensile stress to mitigate gravity-induced sag of the membrane upon release from substrate 202. However, the magnitude of the residual stress in layer 204 must be below the fracture stress of membrane 206. For the purposes of this Specification, including the appended claims, the term "fracture stress" is defined as the magnitude of residual stress in a layer at which a membrane of a given size made from that layer will fracture upon its release from its underlying substrate. One skilled in the art will recognize that the fracture stress for membrane 206 decreases as its lateral dimensions increase. In other words, for a given level of residual stress in layer 204, there is a maximum lateral dimension (e.g., diameter or width) with which membrane 206 can be formed. If this lateral dimension is exceeded, the fracture stress for the material is exceeded and the membrane will fracture upon its release from substrate 202.

To satisfy these conflicting requirements, in the prior art, layer 204 is formed as a one-micron-thick layer of silicon nitride having an increased silicon content (i.e., silicon-rich silicon nitride). The silicon content is chosen to reduce the magnitude of its residual tensile stress to approximately 300 MPa from the residual tensile stress of approximately 1 GPa for stoichiometric silicon nitride (i.e., $Si_3N_4$).

While it would be preferable to use stoichiometric silicon nitride for layer 204 to realize a more taut membrane that would exhibit less gravity-induced sag, the high residual stress of $Si_3N_4$ limit the size of such a membrane to lateral dimensions of less than a few millimeters. As a consequence of the reduced tensile stress in layer 204, the separation between the top surface 212 of mask 200 and surface 218 of target substrate 216 is a function of radial distance from the center of the membrane non-uniform, s(x). The non-uniformity of this separation exacerbates the problem of feathering for prior-art shadow-mask-based direct patterning.

Embodiments in accordance with the present disclosure, however, employ a composite structural layer from which a shadow-mask membrane is formed, where the composite layer has a plurality of constituent layers whose thicknesses and/or stresses are selected to effect:

i. compensation of a residual tensile stress in a first constituent layer with a complimentary residual stress in a second constituent layer, where the residual tensile stress of the first constituent layer is higher than the fracture stress of a membrane formed from the layer; and/or ii. a membrane having a mechanical pre-bias that gives rise to a bending moment directed opposite to the direction of gravity when the shadow mask is installed in its intended deposition system.

As discussed below, by selecting the thicknesses and residual stresses of the constituent layers of a structural layer from which a shadow-mask membrane is formed, the membrane can be formed such that it has a tendency to "bulge" in the direction opposite gravity when installed in system 100. When oriented in a plane that enables the force of gravity to act in opposition to this tendency, the bulge is reduced and, preferably, substantially eliminated. The amount of mechanical pre-bias is typically based on the orientation of the shadow mask in the chamber during deposition (normally known a-priori) such that when the shadow mask is installed in the deposition system, a substantially flat membrane is realized.

FIG. 3 depicts a schematic drawing of a cross-sectional view of a shadow mask 108. Shadow mask 108 includes handle substrate 302, structural layer 304, and apertures 126. It should be noted that FIG. 3 depicts shadow mask 108 without accounting for the effect of gravity on the membrane.

Figure 4:
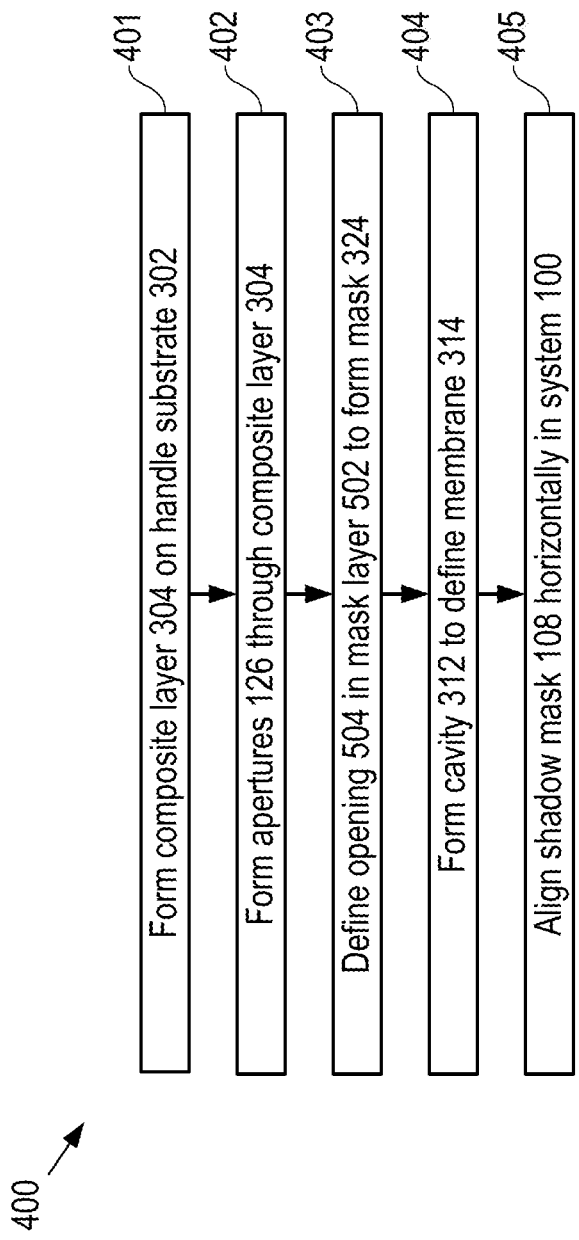
FIG. 4 depicts operations of a method for forming a mechanically pre-biased shadow mask in accordance with the illustrative embodiment.

FIG. 4 depicts operations of a method for forming a mechanically pre-biased shadow mask in accordance with the illustrative embodiment. Method 400 is described herein with continuing reference to FIG. 3, as well as reference to FIGS. 5A-D. Method 400 begins with operation 401, wherein composite layer 304 is formed on handle substrate 302.

Handle substrate 302 is a conventional silicon wafer suitable for use in planar processing. In some embodiments, substrate 302 comprises a different material suitable for use in planar processing. Materials suitable for use in substrate 302 include, without limitation, silicon compounds, compound semiconductors, other semiconductors, ceramics, composite materials, and the like.

Composite layer 304 is a structural layer comprising layers 308 and 310. Layers 308 and 310 are in intimate physical contact such that neither layer can move independently of the other.

In the depicted example, layer 308 is a layer of stoichiometric silicon nitride having a thickness of approximately 50 nm and a residual tensile stress of approximately 1 GPa. Layer 308 is deposited on top surface 306 of substrate 302 via low-pressure chemical vapor deposition (LPCVD). One skilled in the art will recognize that the "as-deposited" residual stress of a stoichiometric silicon nitride layer is based on the conditions under which it is deposited, including the material of the substrate on which it is deposited, deposition temperature, deposition rate, chamber pressure, precursor gas selection, etc. For the purposes of this Specification, including the appended claims, the term "as-deposited residual stress" is defined as the residual stress that exists in a layer of material as a consequence of its formation on a given substrate before any mechanical relaxation in the layer is enabled (neglecting wafer bow)—for example, by releasing a portion of the layer to form a membrane. In some embodiments, the stress of layer 308 is other than 1 GPa. In some embodiments, layer 308 is deposited via a conventional deposition process other than LPCVD, such as atomic-layer epitaxy, plasma-enhanced chemical vapor deposition (PECVD), sputtering, and the like. In some embodiments, layer 308 comprises a material other than stoichiometric silicon nitride, such as silicon-rich silicon nitride, silicon oxynitride, one or more metals, one or more polymers, etc.

Layer 310 is a layer of stoichiometric silicon dioxide having a thickness of approximately one micron and a residual compressive stress of approximately 400 MPa. Layer 310 is formed on layer 308 by LPCVD using a precursor gas of tetraethyl orthosilicate (TEOS). One skilled in the art will recognize, after reading this Specification, however, that layer 310 can be formed in myriad conventional ways, such as spin-coating, atomic-layer deposition, PECVD, sputtering, and the like. As for layer 308, the specific value of the "as-deposited" residual stress in layer 310 is a function of its material, as well as the conditions under which it is deposited, including the material of the substrate on which it is deposited, deposition temperature, deposition rate, chamber pressure, precursor gas selection, etc. As a result, the stress of layer 310 can be other than 400 MPa without departing from the scope of the present disclosure. In some embodiments, layer 310 comprises a material other than stoichiometric silicon dioxide, such as a different silicon oxide, silicon oxynitride, one or more metals, one or more polymers, etc.

In the depicted example, the residual stress in layer 310 is compressive, which compensates, at least partially, the high residual tensile stress in layer 308. As a result, the composite layer is characterized by an "effective" residual stress that is less than the fracture stress of layer 308. This enables a larger membrane without fracture, while still maintaining the high tension desirable in the stoichiometric silicon nitride layer to effect a membrane with less gravity-induced sag.

In some embodiments, the layer structure of composite layer 104 is reversed such that layer 310 is disposed directly on substrate 302. In such embodiments, layer 310 can be formed by oxidizing the top surface of handle substrate 302 in conventional fashion.

Composite layer 304 is characterized by neutral plane 316, which is the plane in its thickness at which the residual stress in the material is equal to zero. Because the residual stress in layers 308 and 310 is unbalanced, the location of neutral plane 316 within the thickness of the composite layer is closer to substrate 302 than the central plane of the composite layer.

In some embodiments, the residual stress in layers 308 and 310 is of the same type (i.e., tensile or compressive) but of different magnitudes. For example, in some embodiments, the residual stress in each of layers 308 and 310 is compressive, but the residual compressive stress in layer 308 is greater (or less) than the residual compressive stress in layer 310. In similar fashion, in some embodiments, the residual stress in each of layers 308 and 310 is tensile, but the tensile stress in layer 308 is greater (or less) than the compressive stress in layer 310.

In the depicted example, the LPCVD deposition of layers 308 and 310 results in deposition of their materials on back surface 322 of substrate 302. The layers formed on back surface 322 collectively define mask layer 502. In some embodiments, mask layer 502 includes one or more different materials that are suitable for protecting a portion of surface 322 during the formation of cavity 312. In some embodiments, mask layer 502 is formed independently of composite layer 304 in a separate operation or set of operations.

Figure 5A:
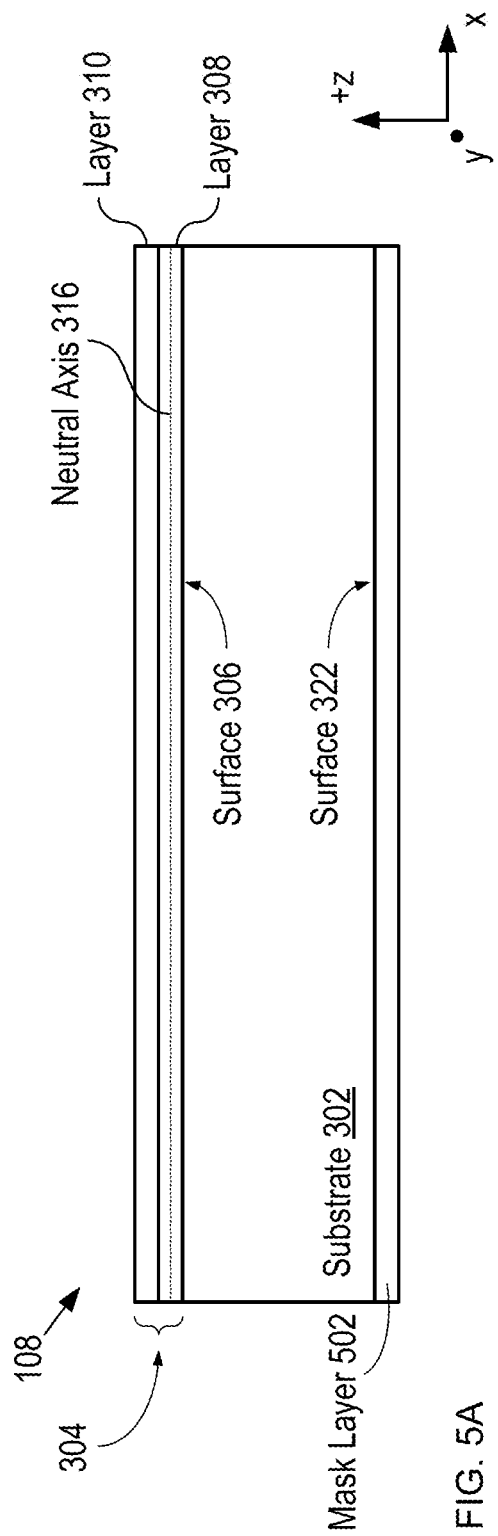
FIG. 5A depicts a schematic drawing of a cross-sectional view of nascent shadow mask 108 after the formation of composite layer 204 on surface 206 and mask layer 402 on surface 222.

FIG. 5A depicts a schematic drawing of a cross-sectional view of nascent shadow mask 108 after the formation of composite layer 304 on surface 306 and mask layer 502 on surface 322.

At operation 402, apertures 126 are formed through the entire thickness of composite layer 304.

Apertures 126 are through-holes formed in composite layer 304 via reactive-ion etching (RIE). In some embodiments, apertures 126 are formed in another conventional manner. Apertures 126 are sized and arranged based on the desired pattern of material to be deposited on a target substrate. In some embodiments, apertures 126 are arranged to match the desired pattern of deposited material. In some embodiments, apertures 126 are arranged in a pattern that compensates for feathering across the area of the substrate. Typically, apertures 126 are formed through composite layer 304 before the formation of cavity 312.

At operation 403, mask 324 is formed on the backside of substrate 302.

To form mask 324, layer 502 is patterned, typical via photolithography and reactive-ion etching (or another conventional etching process) to define opening 504, thereby exposing the central region of surface 322.

Figure 5B:
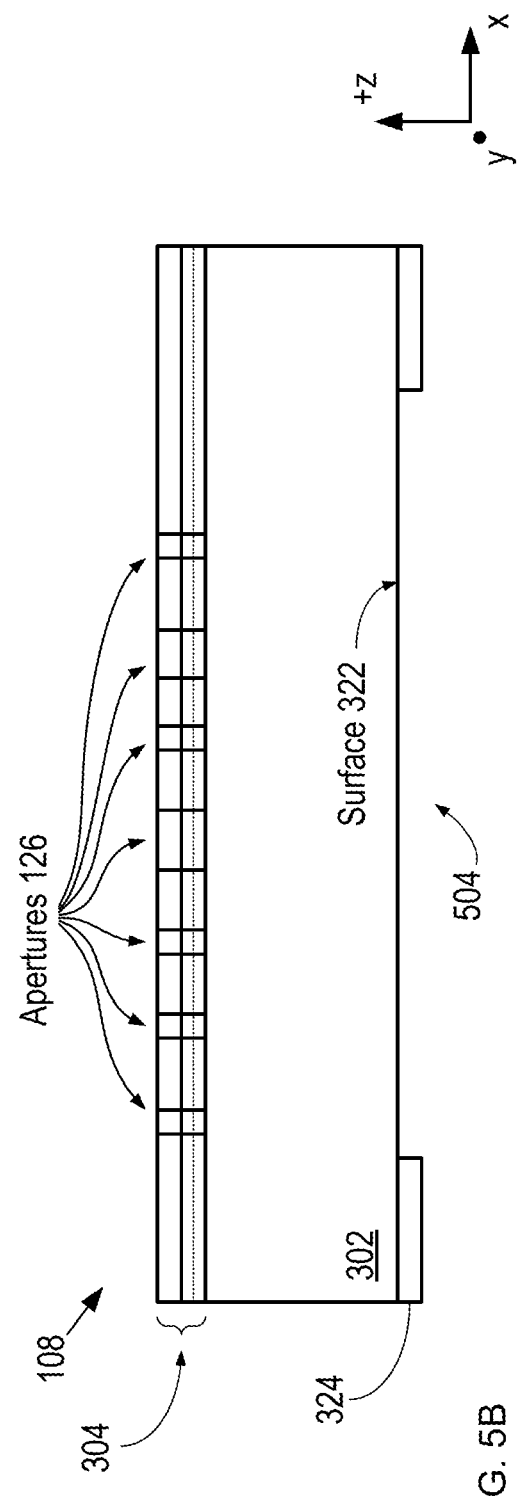
FIG. 5B depicts a schematic drawing of a cross-sectional view of nascent shadow mask 108 after the definition of apertures 126 and mask 224.

FIG. 5B depicts a schematic drawing of a cross-sectional view of nascent shadow mask 108 after the definition of apertures 126 and mask 324.

At operation 404, membrane 314 is defined by releasing a portion of composite layer 304 from handle substrate 302 by forming cavity 312. It should be noted that, preferably, cavity 312 is not formed until after the deposition of all of the layers of composite layer 304. In some embodiments, cavity 312 is partially formed prior to the formation of at least one of the constituent layers of composite membrane 314.

Cavity 312 is formed by removing the material in the center of handle substrate 302 while leaving the outer portion of substrate 302 as annular support frame 506, which extends around the perimeter of composite layer 304. In the depicted example, cavity 312 is formed by removing the exposed silicon region via a crystallographic dependent etch (e.g., ethylene diamine pyrocatechol (EDP), potassium hydroxide (KOH), hydrazine, etc.). In some embodiments, cavity 312 is formed via deep reactive-ion etching, or other conventional process.

Upon release of membrane 314 from the handle substrate, each of layers 308 and 310 partially relaxes to relieve internal strain (which is due to its residual stress). In the depicted example, the free portion of layer 308 attempts to contract (due to its residual tensile stress) while the free portion of layer 310 attempts to expand (due to its residual compressive stress). It should be noted that, without the presence of tensilely stressed layer 308, the released portion of layer 310 is mechanically bi-stable such that it is equally likely to buckle inward (i.e., toward substrate 302) or outward. The inclusion of tensilely stressed layer 310, however, causes the bulge to manifest outward because that configuration represents the lower energy state for the composite membrane. In other words, if the bulge were inward, the tensilely stressed layer would have higher strain due to its position on the outer (i.e., larger) surface of the bulge. In contrast an outward bulge locates the tensile layer on the inner (i.e., smaller) surface of the composite membrane.

In some embodiments, cavity 312 is formed such that a thin layer of silicon remains in contact with composite membrane 314, thereby defining a membrane that includes an additional layer of silicon.

Figure 5C:
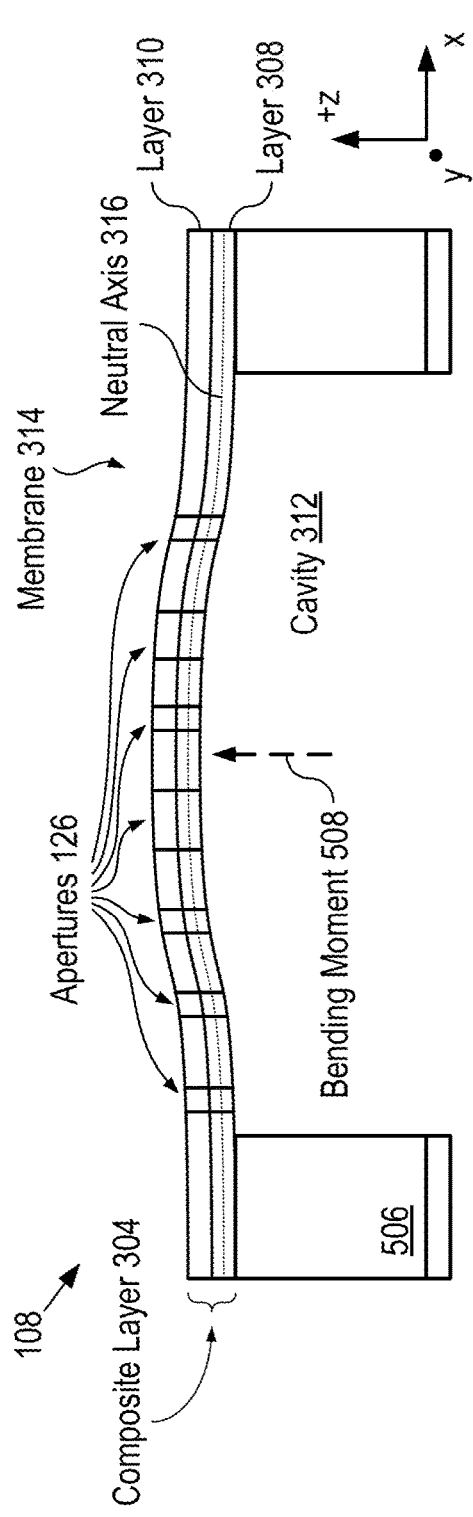
FIG. 5C depicts a schematic drawing of a cross-sectional view of nascent shadow mask 108 after the formation of cavity 212.

FIG. 5C depicts a schematic drawing of a cross-sectional view of nascent shadow mask 108 after the formation of cavity 312. It should be noted that this depiction of the shadow mask does not account for the effect of gravity-induced sag on the shadow mask membrane.

In the depicted, example, the stress configuration of layers 308 and 310 locates neutral axis 316 of membrane 314 below the central plane of composite layer 304 (i.e., the plane located at half its thickness), which gives rise to a bending moment 508 directed in the positive z direction.

In some embodiments, the thicknesses and/or stresses of layers 308 and 310 are selected to effect an inward bulge of membrane 314 (i.e., it bulges in the negative z-direction toward substrate 302).

It should be noted that, although the illustrative embodiment comprises a composite layer having two layers of opposite stress, other layer configurations that effect a mechanical prebias in the composite layer are within the scope of the present disclosure. Alternative layer configurations for composite membranes in accordance with the present disclosure include: membranes having more than two layers; membranes having multiple layers of the same stress, wherein at least two of the layers have residual stresses of different magnitudes; membranes having layers whose thicknesses and residual stresses induce a bulge directed along the direction from the compressively stressed layer to the tensilely stressed layer, and the like.

By choosing the thicknesses and internal stresses of layers 308 and 310 appropriately, the force on the membrane due to residual-stress-induced bending moment 508 can balance, or partially balance) the force due to gravity-induced bending moment 510, which arises when the shadow mask is oriented such that gravity is directed in the negative z direction.

As a result, embodiments in accordance with the present disclosure mitigate gravity-induced sag that arises in prior-art shadow masks when they are mounted in a deposition chamber.

At operation 405, shadow mask 108 is located in system 100 such that the shadow mask is oriented in a horizontal position (i.e., in the x-y plane). As a result, angle θ is equal to 90° and residual-stress-induced bending moment 508 and gravity-induced bending moment 510 are perfectly opposed and balanced. As a result, the top surface of shadow mask 108 is flat and defines plane 120.

Figure 5D:
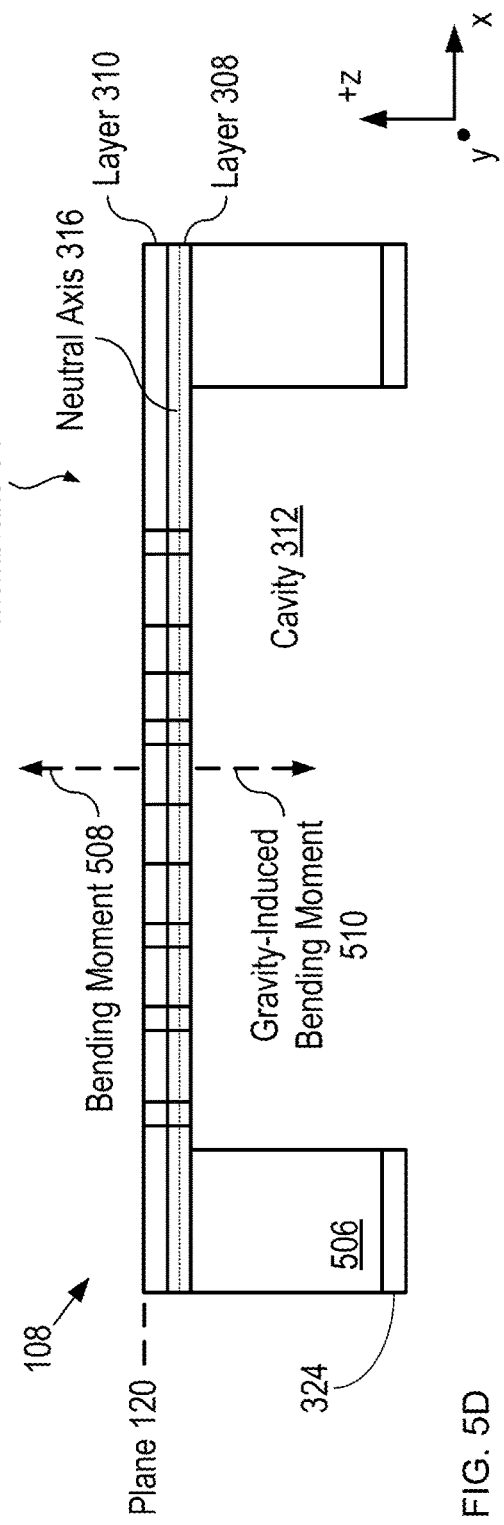
FIG. 5D depicts a schematic drawing of a cross-sectional view of nascent shadow mask 108 when oriented such that residual-stress-induced bending moment 218 and gravity-induced bending moment 408 are balanced.

FIG. 5D depicts a schematic drawing of a cross-sectional view of nascent shadow mask 108 when oriented such that residual-stress-induced bending moment 508 and gravity-induced bending moment 510 are balanced.

It is to be understood that the disclosure teaches just some embodiments in accordance with the present disclosure and that many variations can easily be devised by those skilled in the art after reading this disclosure and that the scope of the invention is determined by the following claims.

What is claimed is:

1. A method comprising forming a shadow mask, wherein the shadow mask comprises a membrane having a first lateral dimension, and wherein the membrane is formed by operations that include:

providing a substrate that defines a first plane;

forming a composite layer on the substrate, the composite layer including:
    a first layer comprising a first material, the first layer having a first thickness and a first residual stress, wherein the first layer is characterized by a fracture stress that is based on the first lateral dimension, and wherein the first residual stress is greater than the fracture stress; and
    a second layer comprising a second material, the second layer having a second thickness and a second residual stress, wherein the second residual stress at least partially compensates the first residual stress such that the composite layer is characterized by an effective residual stress that is lower than the fracture stress;

defining an aperture pattern in a first region of the composite layer, wherein the aperture pattern includes at least one aperture, and wherein the at least one aperture extends completely through both of the first and second layers; and forming a cavity in the substrate, wherein the cavity is formed after the formation of the composite layer, and wherein the formation of the cavity releases the first region of the composite layer to define the membrane;

wherein the first residual stress and second residual stress collectively define a stress gradient in the composite layer that is directed along a first direction that is normal to the first plane.

2. The method of claim 1 further comprising:

aligning the shadow mask and a target substrate having a first surface that defines a second plane, wherein, when the shadow mask and target substrate are aligned, the first plane and second plane are substantially parallel and the stress gradient mitigates the force of gravity on the membrane; and depositing a third material on the target substrate through both of the first and second layers to form a material pattern on the first surface, the material pattern being based on the aperture pattern.

3. The method of claim 1 further comprising forming the first layer such that the first material is stoichiometric silicon nitride and the first residual stress is a tensile stress having a magnitude of approximately 1 GPa.

4. The method of claim 3 further comprising forming the second layer such that the second material is stoichiometric silicon dioxide.

5. The method of claim 1 wherein the composite layer is formed such that the first residual stress is tensile and the second residual stress is compressive.

6. The method of claim 1 wherein the composite layer is formed such that the first residual stress and the second residual stress are compressive.

7. The method of claim 1 wherein the composite layer is formed such that the first residual stress and the second residual stress are tensile.

8. The method of claim 1 wherein the composite layer is formed such that the plurality of layers includes a third layer.

9. The method of claim 1 wherein the stress gradient induces a first bending moment in the composite layer, and wherein the first bending moment is substantially equal to a second bending moment in the composite layer that is based on the force of gravity on the membrane, and further wherein the first and second bending moments are directed in opposite directions.

10. The method of claim 1 wherein the first thickness, second thickness, first residual stress, and second residual stress are selected such that the stress gradient induces a first bending moment in the composite layer that has a magnitude sufficient to induce a curvature of the membrane.

11. The method of claim 1 wherein the second layer is formed on the first layer while the first layer is characterized by its as-deposited residual stress.

\* \* \* \* \*